United States Patent
Sugihara

(10) Patent No.: US 7,116,558 B2
(45) Date of Patent: Oct. 3, 2006

(54) SERVER RACK

(75) Inventor: Osamu Sugihara, Tokyo (JP)

(73) Assignee: Honda Kosan Co., Ltd., Tokyo (JP)

( * ) Notice: Subject to any disclaimer, the term of this patent is extended or adjusted under 35 U.S.C. 154(b) by 0 days.

(21) Appl. No.: 10/477,318

(22) PCT Filed: May 7, 2002

(86) PCT No.: PCT/JP02/04433

§ 371 (c)(1),
(2), (4) Date: May 20, 2004

(87) PCT Pub. No.: WO02/093333

PCT Pub. Date: Nov. 21, 2002

(65) Prior Publication Data

US 2004/0195944 A1    Oct. 7, 2004

(30) Foreign Application Priority Data

May 11, 2001    (JP) .............................. 2001-142145

(51) Int. Cl.
*A47B 81/00* (2006.01)
(52) U.S. Cl. ...................... 361/724; 361/727; 361/687; 361/695; 361/683
(58) Field of Classification Search ................ 361/816, 361/679, 600, 800, 724–727, 730, 796, 683–686, 361/752, 797; 174/35 R, 35 GC, 52.1; 312/283
See application file for complete search history.

(56) References Cited

U.S. PATENT DOCUMENTS 5,067,143 A * 11/1991 Watanabe et al. ........... 378/110
5,216,579 A * 6/1993 Basara et al. ............... 361/683
5,801,921 A * 9/1998 Miller ........................ 361/686
5,975,735 A * 11/1999 Schmitt ......................... 700/2
6,050,658 A * 4/2000 O'Sullivan et al. ...... 312/223.1
6,157,534 A * 12/2000 Gallagher et al. .......... 361/683
6,169,249 B1 * 1/2001 Teachout et al. ........... 174/52.1

FOREIGN PATENT DOCUMENTS

| JP | 02-073799 U1 | 6/1990 |
| JP | 09-083170 A1 | 3/1997 |
| JP | 09-298371 A1 | 11/1997 |
| JP | 11-225835 A1 | 8/1999 |
| JP | 2000-315887 A1 | 11/2000 |
| JP | 2001-60772 A1 | 3/2001 |

* cited by examiner

*Primary Examiner*—Kamand Cuneo
*Assistant Examiner*—Hoa C. Nguyen
(74) *Attorney, Agent, or Firm*—Rader, Fishman & Grauer PLLC

(57) ABSTRACT

A server and data stored in a memory element or a storage medium can be protected from harmful electromagnetic waves from the outside. Shield fingers are arranged along the circumferences of openings of a front door 16 of an upper main body 12 housing servers and a router in an internal space 27. In addition, a shield finger is arranged along the circumference of an opening of a lower front door 18 of a lower main body housing a main body of an electric circuit component such as filter 26. The main bodies and the doors are made of steel and have predetermined thicknesses (40 mm in a bent portion and 21 mm in other portions). In addition, an optical fiber is used as a data line, which is led in an internal space 27 of the upper main body through a conduit 40.

7 Claims, 8 Drawing Sheets

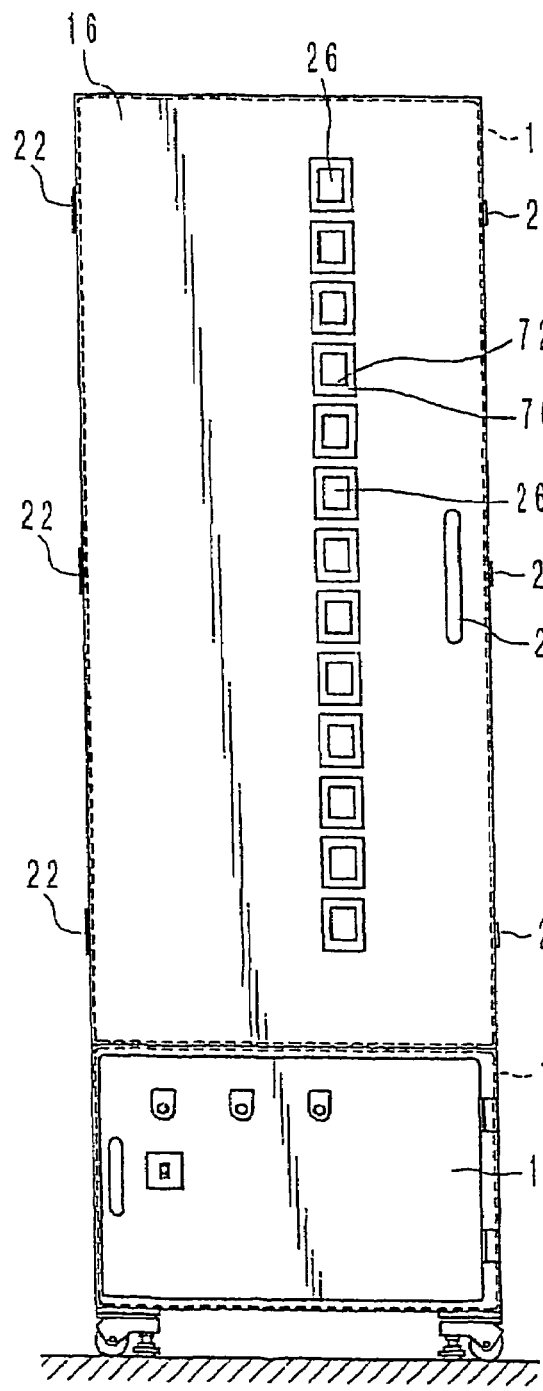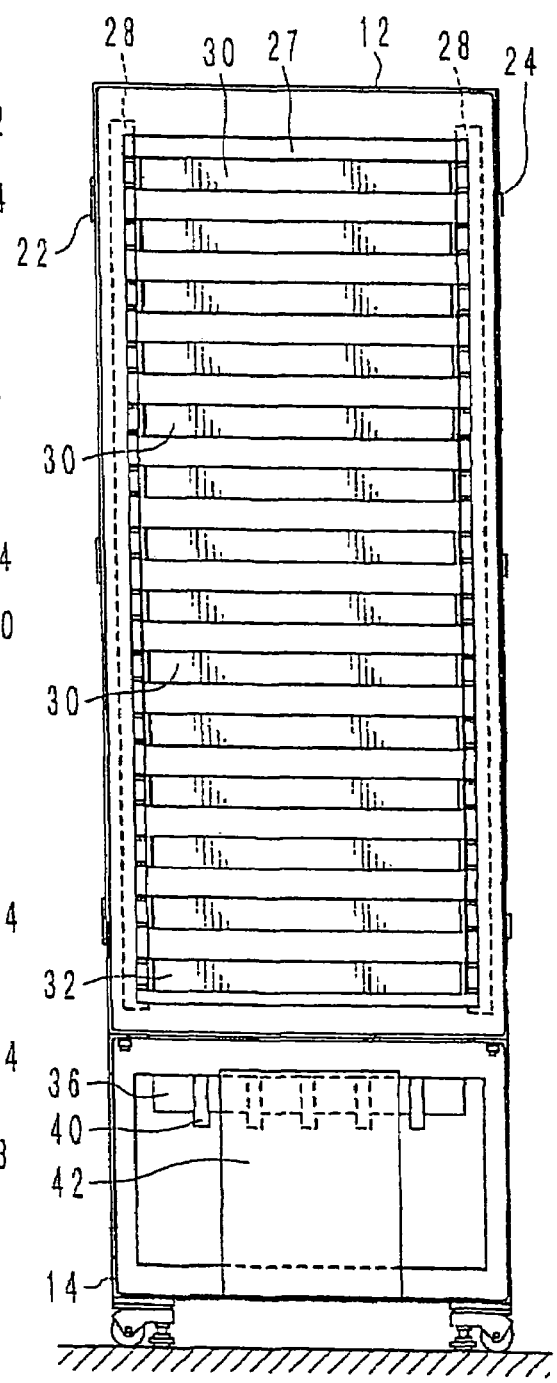

SERVER RACK

TECHNICAL FIELD

The present invention relates to a server rack which blocks electromagnetic waves to protect a server in the inside thereof.

BACKGROUND ART

With remarkable spread of the Internet and computerization of businesses, a variety of servers are arranged in various facilities. In addition, many of these servers are connected to an external network such as the Internet and constituted such that an access from the outside is possible.

Such servers are exposed to threats such as information leak and information forgery when the servers face acts including the access from the outside. To cope with these threats, a technique for prohibiting accesses other than those of legitimate opposite parties is established through construction of a firewall.

On the other hand, since a computer itself emits feeble electromagnetic waves, data is likely to be leaked. Further, it is reported that a computer has very low resistance against electromagnetic waves and malfunctions because of a signal emitted by an illegal CB radio or the like, or it is likely that an element or a storage device of the computer is destroyed.

In particular, in a data center of a provider where various web servers and database servers are arranged and a data center of a financial institution or a public organization where a database server, in which individual information of customers or residents are stored, is arranged, it is likely that considerable damage is caused by malfunction of the servers or destruction of the stored data due to intentional irradiation of electromagnetic waves (e.g., cyber terrorism).

It is an object of the present invention to provide a rack which can protect a server and data stored in a memory element or a storage medium from harmful electromagnetic waves from the outside.

DISCLOSURE OF THE INVENTION

The object of the present invention is attained by a server rack which comprises an upper main body which defines an internal space and is provided with two openings in a fixed direction and formed of metal with a fixed thickness, a lower main body which is at least provided with one opening in the fixed direction and formed of metal with a fixed thickness; a front door which closes one opening of the upper main body in a closing position thereof; a back door which closes the other opening of the upper main body in a closing position thereof; and a lower front door which closes the opening of the lower main body in a closing position thereof, and is capable of housing at least plurality of servers in a stacked state in the internal space of the upper main body, the server rack is characterized by comprising shield fingers which are arranged along circumferences of the respective openings of the upper main body, a shield finger which is arranged along a circumference of the opening of the lower main body, intake holes which are arranged in the upper main body, the front door, and/or the back door, and has at least shield members arranged in hole portions thereof; exhaust holes which are arranged in the upper main body, the front door, and/or the back door, and has at least shield members arranged in hole portions thereof, a plurality of conduits which pierce the upper main body and the lower main body, an optical fiber cable which passes through the conduit to reach the internal space of the upper main body from the lower main body, a light-transforming adapter which is arranged in the internal space, connected to the optical fiber cable, and converts an optical signal transmitted through the optical fiber into an electric signal, a power supply line which passes through another conduit to reach the internal space of the upper main body from the lower main body, an AC stabilized power supply which is arranged in the internal space and connected to the power supply line, and an isolation transformer which is arranged in the internal space and connected to the AC stabilized power supply, and being connected to a plurality of sockets for supplying power to the server on a secondary side thereof.

In a preferred embodiment, the exhaust holes are provided in a top board of the upper main body and are fans having blades driven by a motor.

In addition, in the preferred embodiment, the intake holes are arranged in the back door.

In another preferred embodiment, further holes piercing the upper main body and the lower main body are provided. Noise filters are attached in the internal space of the lower main body through the holes. In addition, terminals of the noise filters are exposed in the internal space of the upper main body through the holes. It is desirable that the noise filters is interposed between the isolation transformer and the sockets.

In a more preferred embodiment, windows for monitoring an operating state of the servers arranged in the internal space from the outside are provided in the front door. The windows have a shield mesh.

BRIEF DESCRIPTION OF THE DRAWINGS

FIG. 2A is a front view of the server rack in accordance with this embodiment;

FIG. 2B is a front view showing a state of the server rack in accordance with this embodiment in which a front door and a lower front door thereof are removed;

DESIRABLE MODE FOR CARRYING OUT THE INVENTION

Figure 1:
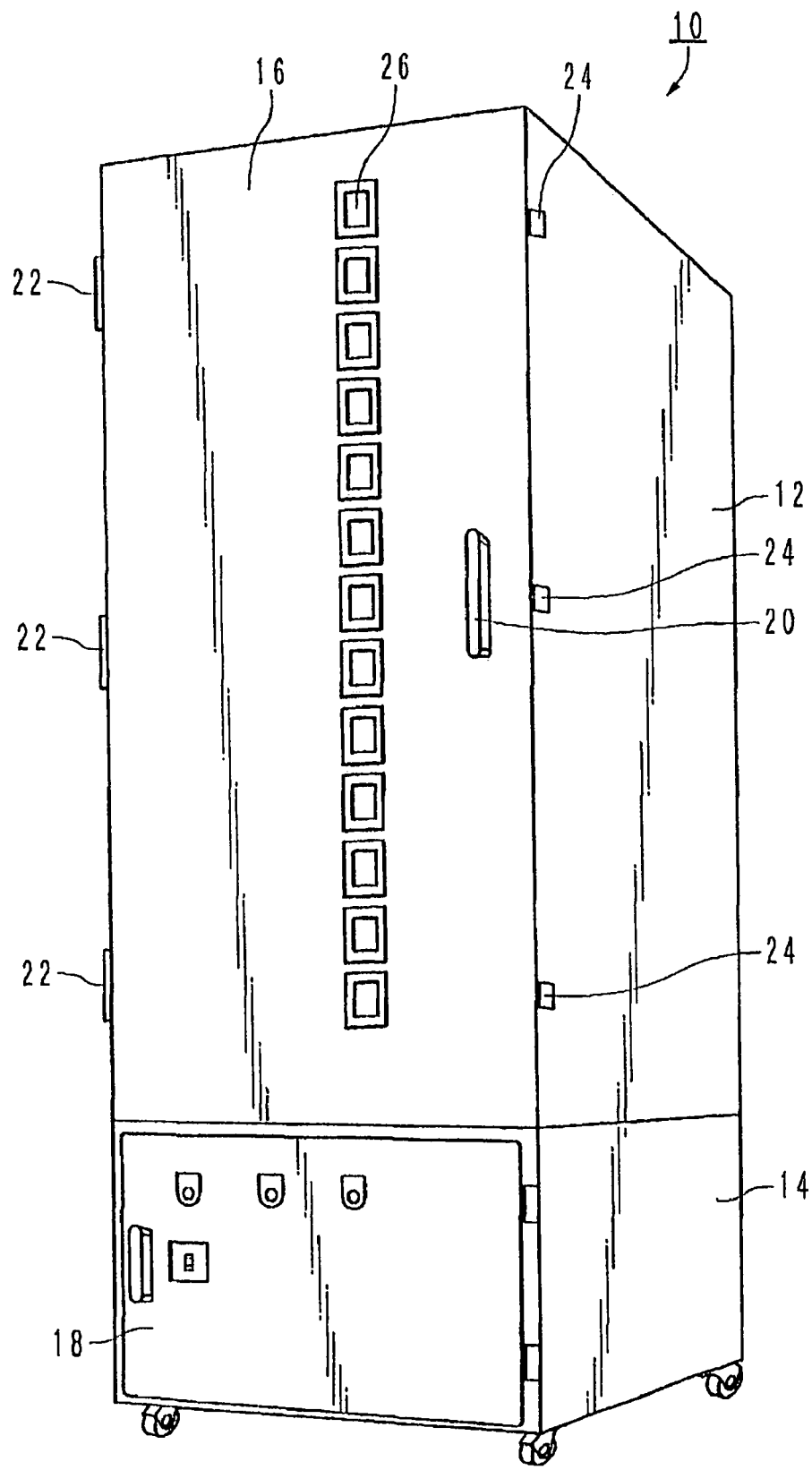
FIG. 1 is a perspective view showing an external appearance of a server rack in accordance with an embodiment of the present invention.

An embodiment of the present invention will be hereinafter described with reference to the accompanying drawings. FIG. 1 is a perspective view showing an external appearance of a server rack in accordance with an embodiment of the present invention. FIG. 2A is a front view of the server rack in accordance with this embodiment. FIG. 2B is a front view showing the server rack in a state in which a front door thereof is removed. As shown in FIG. 1 and FIG. 2A, a server rack 10 includes an upper main body 12 and a lower main body 14 which are made of steel. On the upper main body 12, an open-closable front door 16 including a handle 20 is arranged, and a back door 48 (not shown in FIG. 1) described later is also arranged on a backside thereof. Servers can be housed in the inside of the upper main body 12 by opening the front door 16. In addition, it becomes possible to perform connection of servers and connection of servers and a router by opening the back door 48. Further, an open-closable lower front door 18 is also arranged on the lower main body 14.

In the server rack in accordance with this embodiment, for example, a thickness of a wall of the upper main body is 40 mm in a bent portion and 21 mm in other portions, and a thickness of the front door and the back door is 21 mm. By forming a housing of such thicknesses with steel, in this embodiment, an electromagnetic wave of 500 V/m can be blocked to protect the server in the inside thereof. The upper main body 12 and the lower main body 14 are not required to be formed integrally, respectively, but may be formed by fixing a plurality of plate members through welding. In this case, welding by the stainless shield welding method is desirable because, with spot welding or attachment by rivets, a shield effect cannot be displayed as a frequency band becomes higher. In addition, it is desirable that the upper main body 12 and the lower main body 14 are joined by the stainless shield welding rather than the spot welding or the attachment by rivets.

In addition, in this embodiment, the server rack 10 has a size of 600 mm in width×900 mm in depth×1880 mm in height.

Three hinges 22 are provided at a predetermined spacing on one side end of the front door 16. In addition, three door locking members 24 are also provided at the predetermined spacing on the other side end and on a sidewall of the upper main body 12. The front door 16 is closely attached and fixed to the front of the upper main body 12. Moreover, in this embodiment, windows 26 allowing a user to watch an operating state of servers from the outside are provided in the front door 16. In this embodiment, since thirteen servers of a 1 U size can be housed in the server rack 10, thirteen windows 26 are provided.

As shown in FIG. 2B, in a space 27 in the upper main body 12, thirteen servers 30 of the 1 U size and one router 32 of the 1 U size can be attached at a predetermined spacing (e.g., 89 mm). The spacing is one for sufficiently providing an air layer for cooling of the servers. As described later, an optical cable from the outside is connected to a light-transforming adapter (not shown) arranged in the space 27, and the light-transforming adapter and the router 32 are connected by an ordinary signal line. A signal based upon 10BASE or 100BASE-FX is outputted from the light-transforming adapter. In addition, since the servers 30 are connected with each other and the router 32 and the servers 30 are also connected in the internal space 27 in a state in which electromagnetism from the outside is blocked, it is sufficient that the ordinary signal line is used for connection between servers 30 or between servers 30 and router 32.

In the internal space 27, attachment panels 28, on which predetermined threaded holes are formed in order to screw the servers 30, are disposed adjacent to the openings of the upper main body 12. The user can attach the servers 30 in the inside of the upper main body 12 by, in a state in which the front door 16 is opened, housing the servers 30 in the inside of the upper main body 12, and aligning threaded holes provided in front panels of the servers and the threaded holes of the attachment panels 28 to insert screws in the threaded holes. The user can also attach the router 32 in the inside of the upper main body 12 in the same manner.

Figure 3:
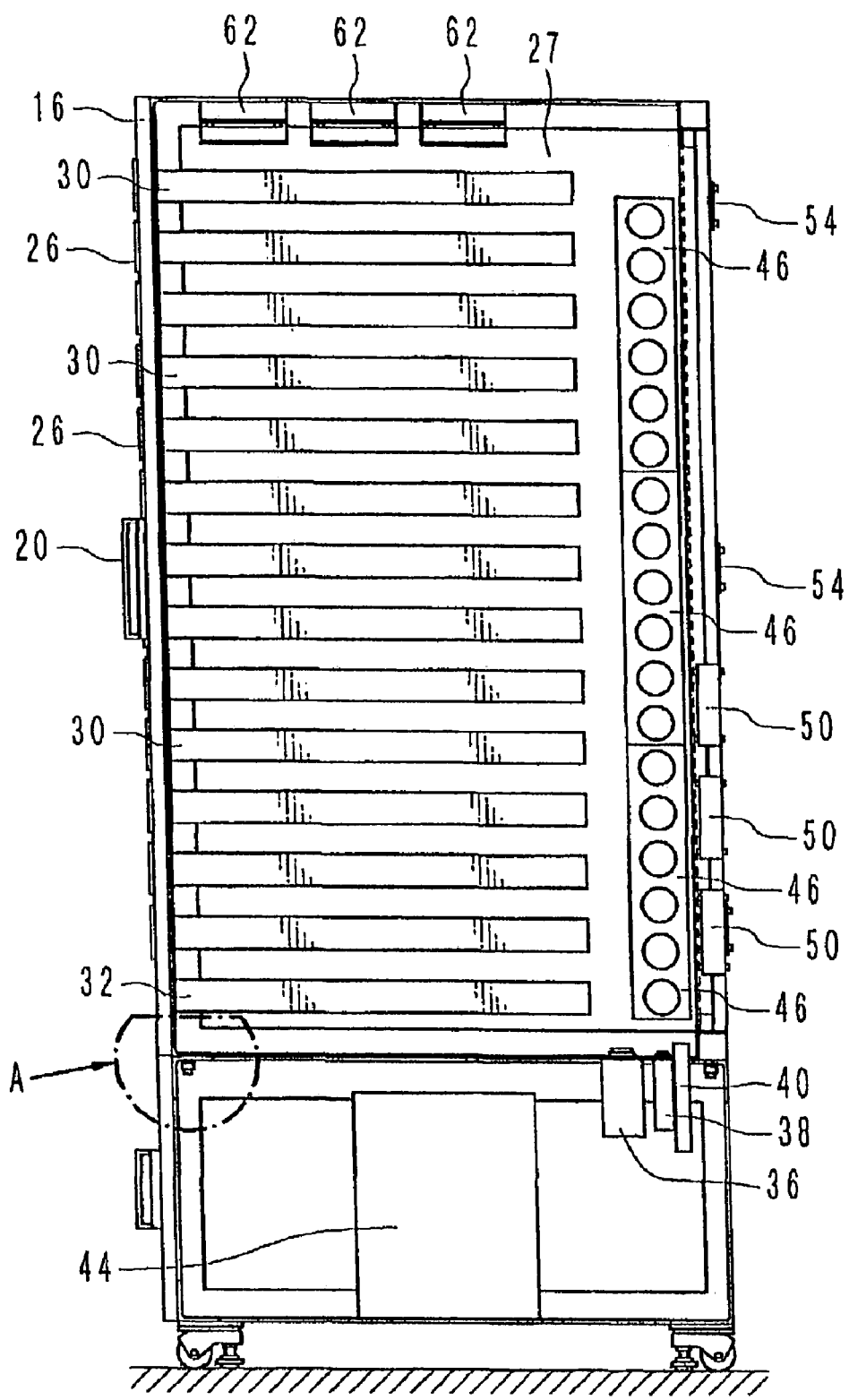
FIG. 3 is a schematic side view of the server rack in accordance with this embodiment in a state in which a sidewall on the front right side thereof is removed.
Figure 5:
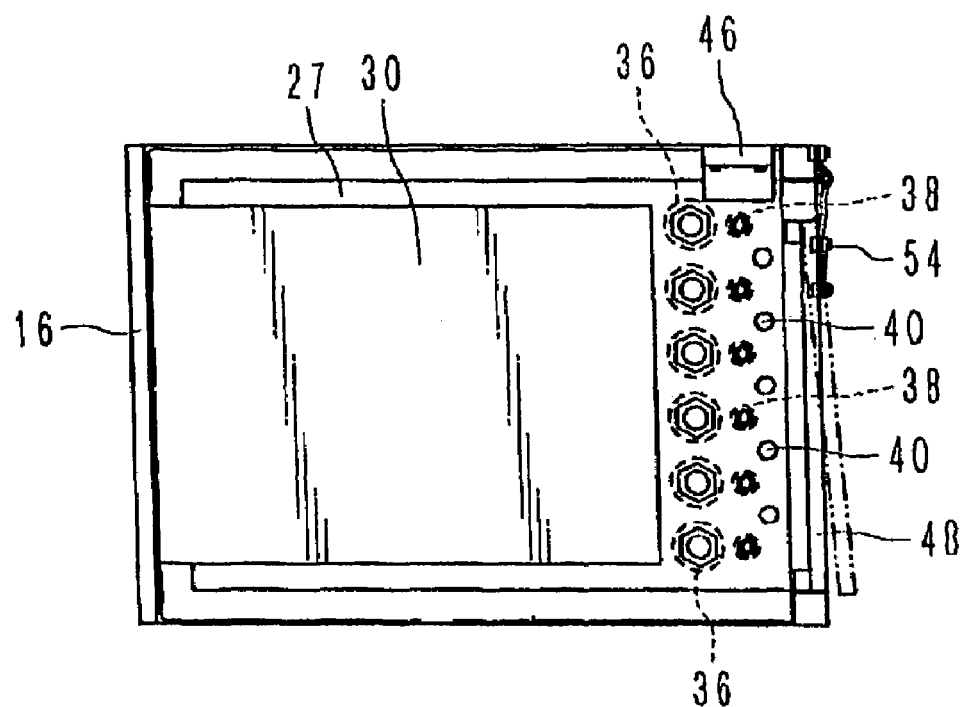
FIG. 5 is a plan view showing a state of the server rack in a state in which a top board of the upper main body thereof is removed.

FIG. 3 is a schematic side view of the server rack 10 in accordance with this embodiment in a state in which a sidewall on a front right side thereof is removed. As shown in FIG. 2B and FIG. 3, power supply boards 46, on which a plurality of outlets (sockets) are attached, are provided on a back side of a left inner wall in the inside of the upper main body 12. In addition, as shown in FIG. 3 and FIG. 5 which is a plan view showing a state of the upper main body 12 of the server rack in which a top board thereof is removed, holes pierced to the lower main body 14 are drilled on a bottom plate of the upper main body 12. Through the holes, a plurality of (six in this embodiment) first power supply filters 36 and a plurality of (six in this embodiment) second power supply filters 38 are attached to the lower main body 14. In the first power supply filters 36 and the second power supply filters 38, terminals are exposed on a bottom plate side of the lower main body 14.

Moreover, a shield plate 42 and a shield plate 44 are arranged substantially in the center inside the lower main body 14. In the inside of a space defined by the shield plates, a main body of a shield transformer described below is arranged. Terminals of the shield transformer are also exposed in a space inside the upper main body 12 through the top board of the lower main body 14 and the upper board of the upper main body 12 as in the power supply filter or the like.

In addition, holes piercing the bottom plate of the upper main body 12 and the top board of the lower main body 14 are drilled in the upper main body 12, and conduits 40 for passing an optical fiber cable or the like described later are provided. Of course, it is desirable to shield unused ones among these conduits 40 with a honeycomb shield or a copper net to increase the shield effect.

Figure 4:
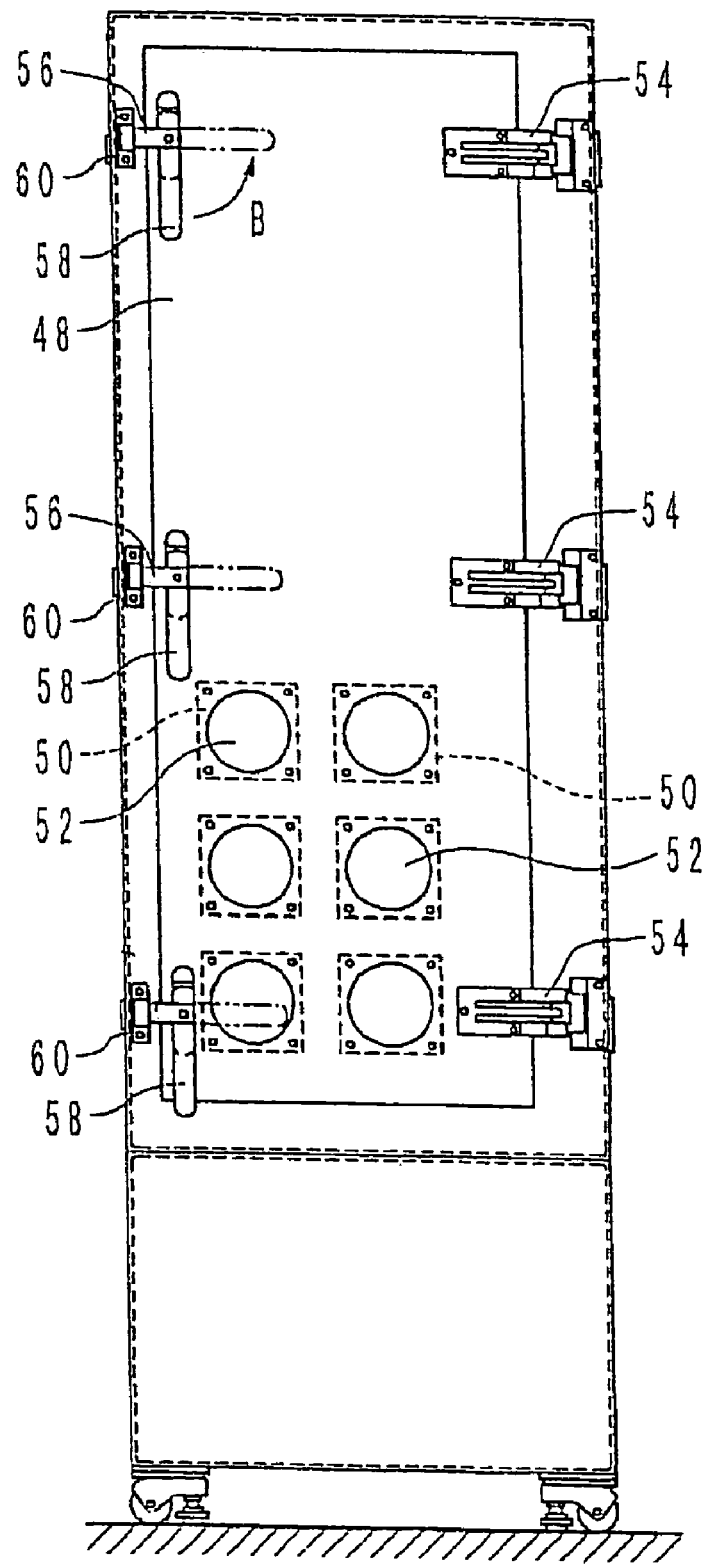
FIG. 4 is a rear view of an upper main body in accordance with this embodiment.

FIG. 4 is a rear view of the upper main body 12. As shown in FIG. 3 and FIG. 4, a back door 48 is provided in the back of the upper main body. A plurality of vent holes 52 are arranged in a lower part of the back door 48. In this embodiment, the vent holes 52 have a diameter of about 120 mm. As shown in FIG. 3, the vent holes 52 are fitted with members 50 provided with a honeycomb shield formed of a copper foil or the like. Alternatively, a shield made of a copper net may be formed. The honeycomb shield is grounded by a single line.

In the back door 48, a plurality of (three in this embodiment) hinges 54 are provided at a predetermined spacing on one side end thereof, and a plurality of (three in this embodiment) closing handles 58 are attached at a predetermined spacing on the other side end thereof. The handles 58 can rotate in a direction of arrow B around a fulcrum. By being pushed to the outside in a horizontal state, the handles 58 are fitted in hole portions of handle receiving members 60 which are provided in corresponding positions on the side end of the upper main body 12. Consequently, the back door 48 is secured firmly.

Figure 6:
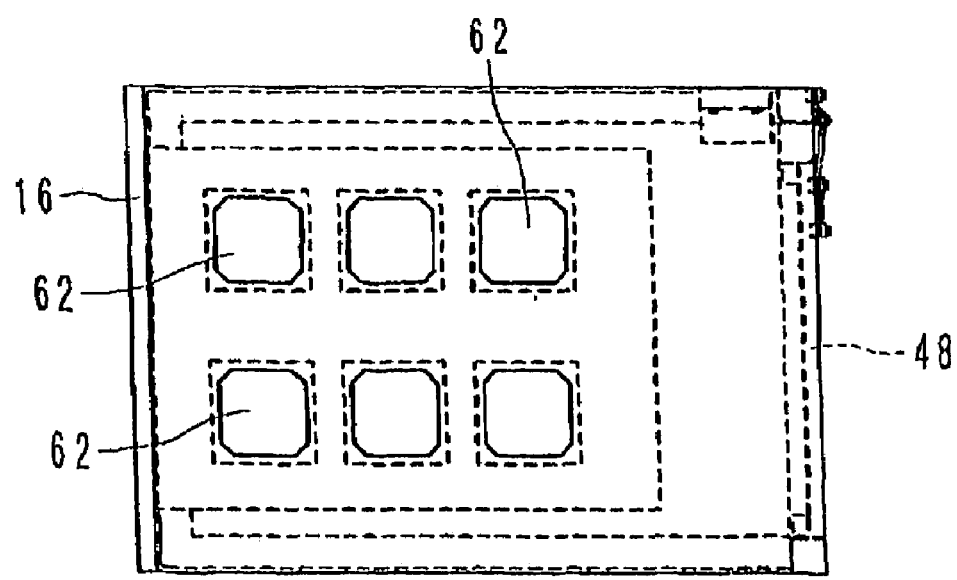
FIG. 6 is a top view of the upper main body in accordance with this embodiment.

FIG. 6 is a top view of the upper main body. As shown in FIG. 3 and FIG. 6, a plurality of (six in this embodiment) fans 62 are provided in the top board of the upper main body 12. In this embodiment, the fans have a diameter of 120 mm. The fans include rotating blades and a motor (both of which are not shown). The fans can ventilate the internal space 27 by receiving supply of power from the outlets (sockets) in the inside of the upper main body 12. The tops of the fans 62 are provided with a shield made of a honeycomb shield or a copper net as in the vent holes 52. In this way, a predetermined shield member, for example, a honeycomb shield is arranged in the openings (the vent holes 52 and the fans 62), whereby electromagnetic waves are prevented from entering the internal space 27.

Figure 7:
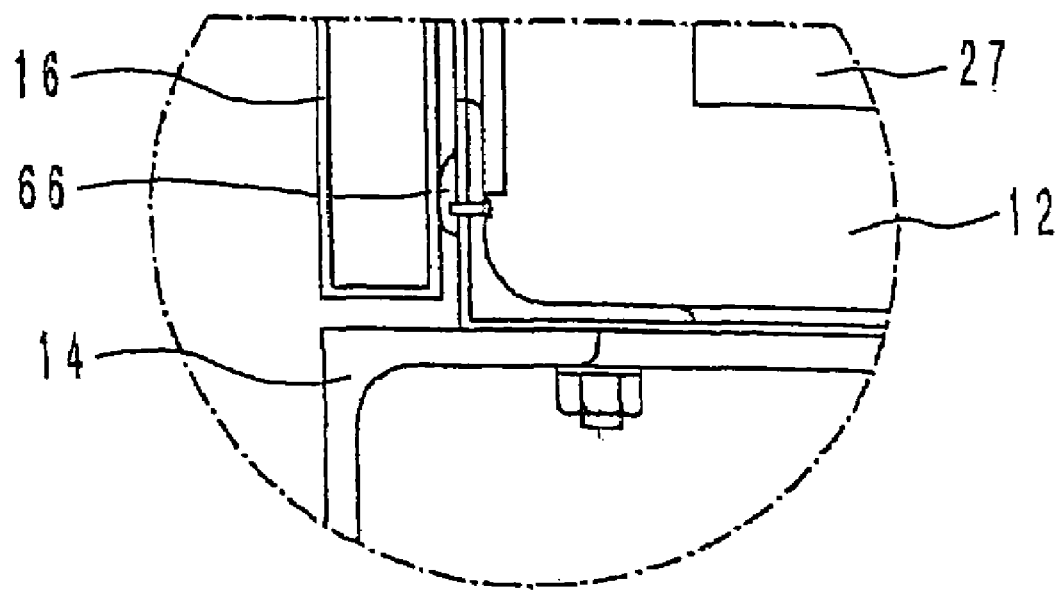
FIG. 7 is an enlarged sectional view of a part A in FIG. 3.

Next, shield for the other openings, that is, the front door 16 and the back door 48 will be described. FIG. 7 is an enlarged sectional view of a part A in FIG. 3. As shown in FIG. 7, in this embodiment, a shield finger 66 is provided between the back of the front door 16 and the front of the upper main body 12. More specifically, it is desirable that the shield finger 66 is attached along the circumference of the opening of the upper main body 12, in particular, so as to be arranged over positions where rivets or the like are drilled. Similarly, in the back door 48, a shield finger (not shown) is also attached along the circumference of the opening in the back. When the back door 48 is closed, the internal space 27 is electromagnetically shielded from the outside by the shield finger. In this way, electromagnetic shield of the opening by the door is realized.

In addition, as shown in FIG. 1 and FIG. 2A, in this embodiment, a plurality of (thirteen in this embodiment) windows 26 are provided in the front door 16 such that a server arranged in the internal space 27 can be seen from the outside. As shown in FIG. 2A, these windows 26 have a structure 70 including an acrylic panel and a shield mesh. Moreover, in order to improve shield of the window openings 26, panel attachment members 72 are attached on the front side of the door 16. It is desirable that these panel attachment members are attached securely to the door 16 by, for example, stainless shield welding. With such a constitution, electromagnetic waves are prevented from passing through the windows 26 to reach the internal space 27.

Figure 8A:
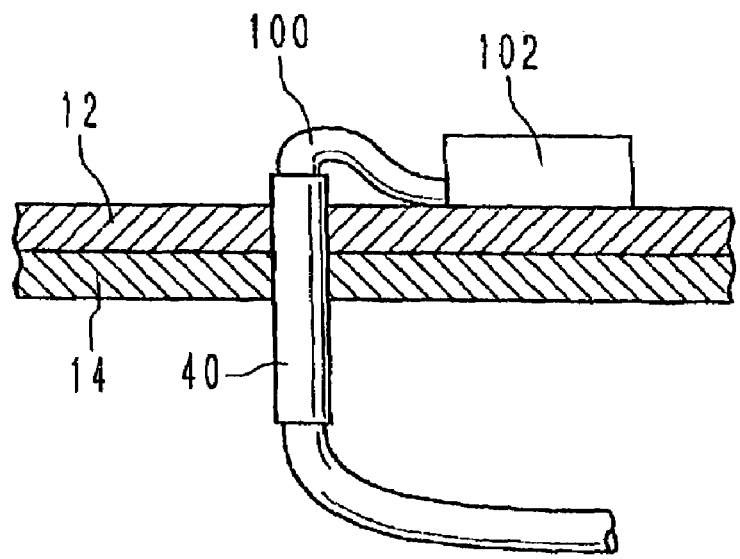
FIG. 8A is a diagram schematically showing a periphery of a conduit in this embodiment.
Figure 8B:
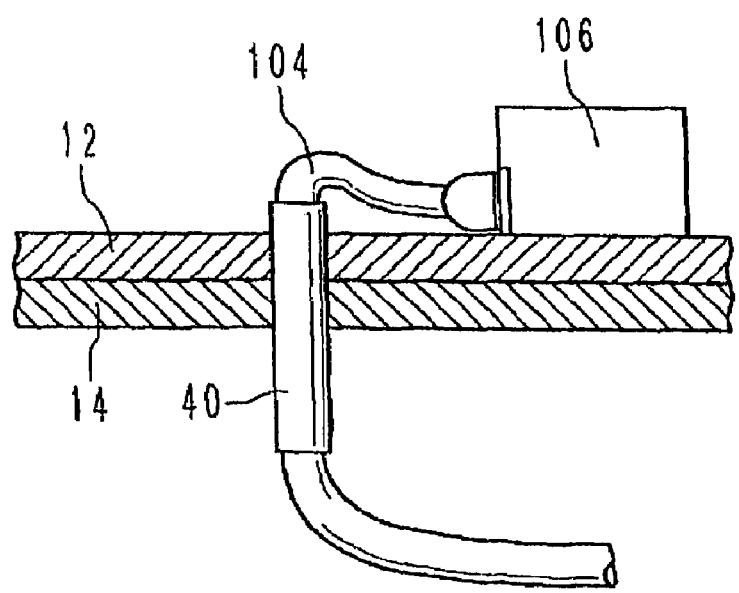
FIG. 8B is a diagram schematically showing another periphery of the conduit in this embodiment.

Next, an electric circuit in the server rack 10 in this embodiment will be described briefly. FIGS. 8A and 8B are schematic views showing various lines passing through the conduits 40 in this embodiment, respectively. In FIG. 8A, an optical fiber cable 100 used as a data line is passed through the conduit 40. This optical fiber cable 100 passes through the conduit 40 to enter the internal space 27 of the upper main body 12, and is connected to a light-transforming adapter 102. In this embodiment, an optical fiber cable not using a metal core wire is desirable as the optical fiber cable 100. This is because the metal core wire is likely to pick up noises. An ordinary signal line extending from the light-transforming adapter 102 is connected to the respective servers 30 and the router 32.

Figure 9:
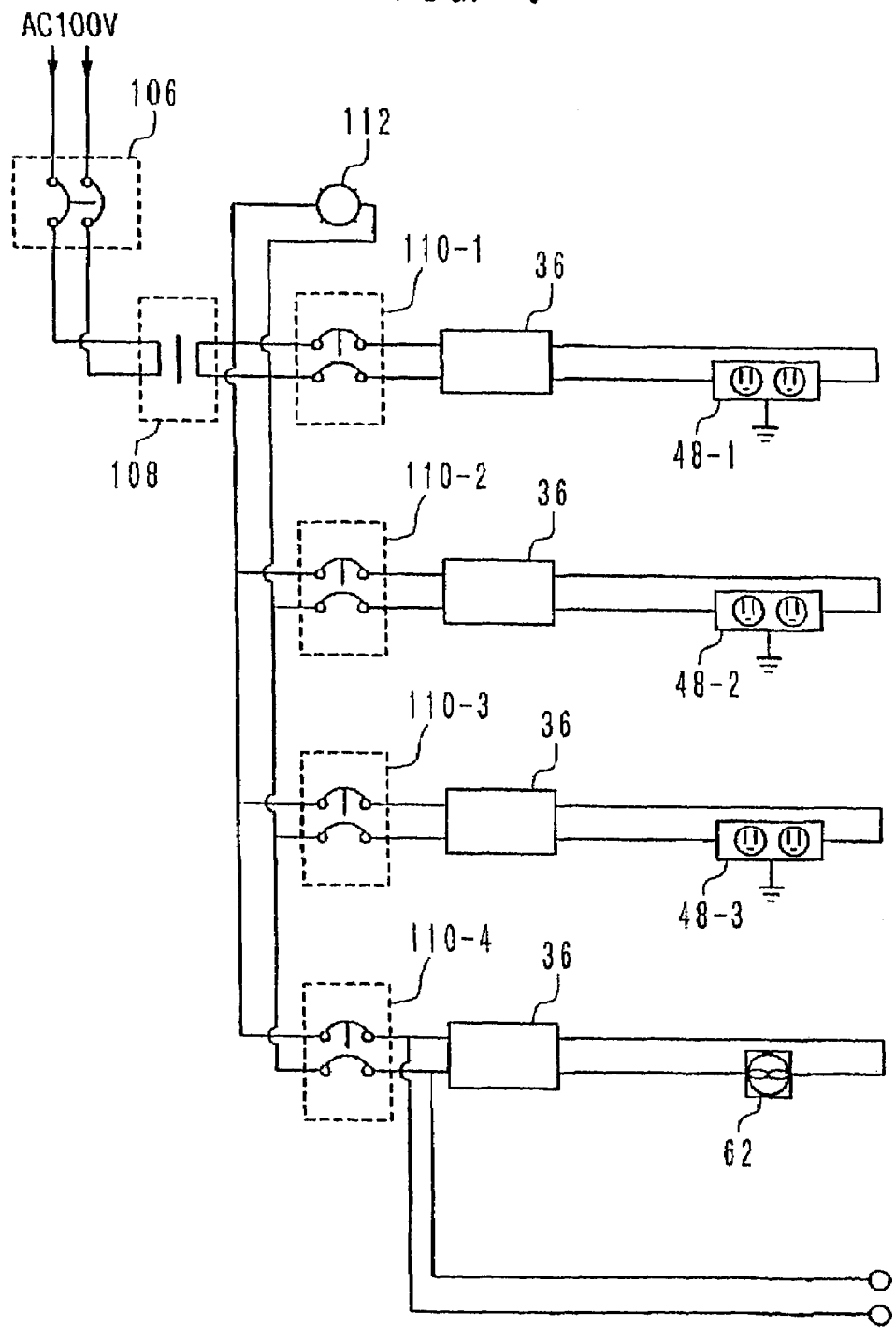
FIG. 9 is a block diagram schematically showing an electric circuit in the server rack in accordance with this embodiment.

In addition, in FIG. 8B, a power supply cable 104 passes through the conduit 40, enters the internal space 27 of the upper main body 12, and is connected to an AC stabilized power supply 106. FIG. 9 is a block diagram schematically showing an electric circuit in the server rack 10. As shown in FIG. 9, a signal line from the AC stabilized power supply 106 extends to a terminal of a transformer 108 such as a shield transformer. Here, a power supply line further on a downstream side than the transformer 108 (i.e., a side where a socket or the like is arranged) and a power supply line further on an upstream side than the transformer 108 are electromagnetically shielded.

Moreover, power supply lines extend to various AC stabilized power supplies 110-1 to 110-4 from the transformer 108, respectively. Power supply lines from the AC stabilized power supply 110-1 to 110-3 are connected to, for example, a group of outlets (sockets) 48-1 to 48-3, respectively, via noise filters 36. In addition, a power supply line from the AC stabilized power supply 110-4 is connected to a motor for driving the blades of the plurality of fans 62 via a noise filter 36. Further, power from the AC stabilized power supply 110-4 is used as a power supply for driving various sensors or driving an alarm lamp or an alarm buzzer. In addition, a power supply line passes a power lamp 112.

Therefore, in the case in which power is supplied to the electric circuit, the power lamp 112 is lit. This power lamp is arranged on the door 18 of the lower main body 14 of the server rack 10 (three round lamps diagonally at the upper right of the handle of the lower front door 18 in FIG. 1 and FIG. 2A). Therefore, the user can learn presence or absence of supply of power in the rack 10. Similarly, it is desirable that the alarm lamp or the alarm buzzer is also arranged on the door 18.

In the above-described example of the electric circuit, the first noise filter 36 is used. However, it is needless to mention that a noise filter is not limited to this and the second noise filter 38 may be used. In addition, a noise cut transformer may be used instead of the shield transformer.

According to this embodiment, the upper main body and the lower main body are formed of steel with a predetermined thickness, respectively, the honeycomb shield is arranged in openings such as vent holes, and the circumference of the door opening portion is surrounded by the shield finger. In addition, a power supply line and a data line are lead in through the conduit 40 from the lower main body to the upper main body. Therefore, it becomes possible to provide a server rack extremely excellent in power for blocking electromagnetic waves.

In addition, according to this embodiment, electric circuit components required to be replaced such as a filter and a transformer are arranged in the lower main body, and only terminals are exposed in the space 27 of the upper main body 12. Therefore, it becomes possible to replace the components in a state in which the servers 30 and the like are housed therein.

Concerning the server rack 10, taking into account a radiation field of an illegal amateur radio or the like, 25 MHz, 50 MHz, and 144 MHz were inspected and evaluated more in detail in a 10 m anechoic chamber in addition to 80 MHz to 1 GHz which was an ordinary immunity test range. As a result, the server rack 10 passed an inspection for shield performance for all the measured frequencies and also passed an immunity test for all the measured frequencies and all field intensity conditions. In this experiment, no abnormality was found in the servers 30 arranged in the server rack 10.

It is needless to mention that the present invention is not limited to the above-described embodiment, and various alterations are possible within the scope of the invention described in claims and the alterations are included in the scope of the present invention.

For example, thicknesses of an upper main body and a lower main body and a door of a server rack are not limited to those in the embodiment but can be changed in accordance with shielding properties of electromagnetic waves. In addition, the number of fans and vent holes can be changed appropriately in accordance with a size of an internal space or the number of servers to be housed.

In addition, in the embodiment, the windows consisting of a shield mesh and an acrylic panel are provided in the front door such that an operating state of servers can be monitored from the outside. However, the present invention is not limited to this. For example, it is also possible to provide a pipe in a vertical direction in the internal space, arrange a vertically movable monitor camera along the pipe, transmit image data of the monitor camera to an external monitoring device via the optical cable passing through the conduit 40, and show a state of the internal space 27 on a screen of a display of the monitoring device.

In this specification, a function of one means may be realized by two or more physical means, or functions of two or more means may be realized by one physical means.

According to the present invention, it becomes possible to provide a rack which can protect a server from harmful electromagnetic waves from the outside.

INDUSTRIAL FIELD OF APPLICATION

The present invention can be used for housing electronic devices, which are affected by electromagnetic waves, such as a server and a hard disk drive. In addition, the server rack in accordance with the present invention can be arranged in an arbitrary environment, in which the electronic devices are used, such as an office and a data center.

The invention claimed is:

1. A server rack which comprises: an upper main body which defines an internal space and is provided with two openings in a fixed direction and formed of metal with a fixed thickness; a lower main body which is at least provided with one opening in the fixed direction and formed of metal with a fixed thickness; a front door which closes one opening of said upper main body in a closing position thereof; a back door which closes the other opening of said upper main body in a closing position thereof; and a lower front door which closes the opening of said lower main body in a closing position thereof, and is capable of housing at least a plurality of servers in a stacked state in said internal space of said upper main body, said server rack comprising:

shield fingers which are arranged along circumferences of the respective openings of said upper main body;

a shield finger which is arranged along a circumference of the opening of said lower main body;

intake holes which are arranged in at least one of said upper main body, said front door, and said back door, the intake holes having at least shield members arranged in hole portions thereof;

exhaust holes which are arranged in at least one of said upper main body, said front door, and said back door, the exhaust holes having at least shield members arranged in hole portions thereof;

a plurality of conduits which pierce said upper main body and said lower main body;

an optical fiber cable which passes through at least one of said plurality of conduits to reach said internal space of said upper main body from said lower main body;

a light-transforming adapter which is arranged in said internal space, connected to said optical fiber cable, and converts an optical signal transmitted through said optical fiber into an electric signal;

a power supply line which passes through at least a remaining one of said plurality of conduits to reach said internal space of said upper main body from said lower main body;

an AC stabilized power supply which is arranged in said internal space and connected to said power supply line; and an isolation transformer which is arranged in said internal space and connected to said AC stabilized power supply, the isolation transformer being connected to a plurality of sockets for supplying power to the servers on a secondary side thereof.

2. The server rack according to claim 1, wherein said exhaust holes are provided in a top board of the upper main body and are fans having blades driven by a motor.

3. The server rack according to claim 1, wherein said intake holes are arranged in said back door.

4. The server rack according to claim 1, wherein holes piercing said upper main body and said lower main body are provided, a main body of said isolation transformer is arranged in said lower main body, and terminals of said isolation transformer are exposed in a space in said upper main body through said holes.

5. The server rack according to claim 1, wherein holes piercing said upper main body and said lower main body are provided, noise filters are attached in said internal space of said lower main body through said holes, and terminals of said noise filters are exposed in said internal space of said upper main body through said holes.

6. The server rack according to claim 1, wherein windows for monitoring an operating state of the servers arranged in said internal space from the outside are provided in said front door, and said windows have a shield mesh.

7. The server rack according to claim 5, wherein said noise filters is interposed between said isolation transformer and said sockets.

* * * * *

UNITED STATES PATENT AND TRADEMARK OFFICE
CERTIFICATE OF CORRECTION

PATENT NO. : 7,116,558 B2  Page 1 of 1
APPLICATION NO. : 10/477318
DATED : October 3, 2006
INVENTOR(S) : Osamu Sugihara It is certified that error appears in the above-identified patent and that said Letters Patent is hereby corrected as shown below:

TITLE PAGE, ITEM (73) Assignee:

The Assignee section should list the following assignee:

Kabushiki Kaisha Mugen (Mugen Co., Ltd.), Saitama-ken (JP)

Signed and Sealed this

Nineteenth Day of June, 2007

JON W. DUDAS
*Director of the United States Patent and Trademark Office*